United States Patent
Nozaki et al.

(10) Patent No.: US 8,389,921 B2
(45) Date of Patent: Mar. 5, 2013

(54) IMAGE SENSOR HAVING ARRAY OF PIXELS AND METAL REFLECTORS WITH WIDTHS SCALED BASED ON DISTANCE FROM CENTER OF THE ARRAY

(75) Inventors: Hidetoshi Nozaki, Sunnyvale, CA (US); Fei Wu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 372 days.

(21) Appl. No.: 12/771,778

(22) Filed: Apr. 30, 2010

(65) Prior Publication Data

US 2011/0266421 A1    Nov. 3, 2011

(51) Int. Cl.
*H01L 27/00* (2006.01)
*H01J 5/16* (2006.01)

(52) U.S. Cl. ..................... 250/208.1; 250/216

(58) Field of Classification Search .............. 250/208.1, 250/216; 348/272–283, 294–323; 438/57, 438/59, 64–67, 69, 70, 73–81; 257/420, 257/431–440, 443, 448
See application file for complete search history.

(56) References Cited

U.S. PATENT DOCUMENTS

| | | | | |
|---|---|---|---|---|
| 7,602,434 B2 * | 10/2009 | Katsuno et al. | .............. | 348/340 |
| 2005/0253212 A1 * | 11/2005 | Nam et al. | .................... | 257/432 |
| 2006/0192883 A1 * | 8/2006 | Katsuno et al. | .............. | 348/340 |
| 2008/0099804 A1 * | 5/2008 | Venezia et al. | ............... | 257/291 |
| 2008/0272419 A1 * | 11/2008 | Furukawa et al. | ............ | 257/292 |

* cited by examiner

*Primary Examiner* — Pascal M Bui Pho
(74) *Attorney, Agent, or Firm* — Blakely Sokoloff Taylor & Zafman LLP (57) ABSTRACT

An image sensor in accordance with embodiments disclosed herein includes an array of imaging pixels, an insulator layer, and a plurality of metal reflectors. The array of imaging pixels are disposed within a semiconductor layer, where each imaging pixel in the array of imaging pixels includes a photosensitive element configured to receive light from a backside of the image sensor. The insulator layer is disposed on a frontside of the semiconductor layer and the plurality of metal reflectors are disposed within the insulator layer to reflect the light to a respective photosensitive element. A width of each of the plurality of metal reflectors is equal to a width of a metal reflector at the center of the array multiplied by a scaling factor, where the scaling factor is dependent on a distance of the metal reflector from the center of the array.

19 Claims, 6 Drawing Sheets

IMAGE SENSOR HAVING ARRAY OF PIXELS AND METAL REFLECTORS WITH WIDTHS SCALED BASED ON DISTANCE FROM CENTER OF THE ARRAY

BACKGROUND

1. Field

Embodiments of the present invention relate to image sensors and, in particular, to metal reflectors for image sensors.

2. Discussion of Related Art

In general, conventional image sensors perform well to generate images. A typical image sensor may be fabricated from a complementary metal oxide semiconductor (CMOS) technology. Charge couple device (CCD) technology is also suitable. Such image sensors include an array of pixels disposed on a substrate, each pixel including a photosensitive element, such as a photodiode, for example, a filter disposed on the photosensitive element, and a microlens disposed on the filter.

The typical image sensor operates as follows. Light such as visible light is incident on the micro-lens. The micro-lens focuses the light to the photosensitive element through the light filter. The photosensitive element converts the light into an electrical signal proportional to the intensity of the light detected. The photosensitive element and a floating diffusion region may be coupled together when an associated transfer transistor is turned on to transfer the charge from the photosensitive element to the floating diffusion. The electrical signals may be coupled to amplification and readout circuitry such as a CMOS transistor (not shown), for example, to generate an image based on the captured light. There may be one or more layers of metal, polysilicon, etc., disposed on the substrate as well.

Some image sensors may use front side illumination (FSI) in which the layers of metal, polysilicon, diffusions, etc., may be disposed on the same side of the substrate as the microlenses and the photosensitive elements. Other image sensors may use back side illumination (BSI) in which the metal layers are on one side of the substrate and the photosensitive elements are on another side of the substrate. In either case, because of the position of the pixel in the image sensor light may have to be focused by the micro-lenses from different angles down onto the photosensitive elements.

Unfortunately, as the angles become larger, some of the light is not focused onto the photosensitive elements, which causes light to be lost and pixel response to decrease. The chief ray is the ray which passes through the center of a camera entrance pupil, and light near the center of the camera entrance pupil enters the pixel. The angle of the chief ray is commonly called the chief ray angle (CRA). At large CRAs, the pixel response drops below a certain percentage (e.g., 80%) of its 0° angle response where the pixel is perpendicular to incident light. The light near the axis of a camera lens enters the pixel with angles near 0°; however as the light moves further from the axis, the angles increase. As a result, there can be crosstalk between the pixels located away from the center of the array. Crosstalk creates noise in the image sensor.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

Embodiments of the present invention include an image sensor with metal reflectors of scaled widths. In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

For some embodiments of the present invention an image sensor includes an array of pixels. Each pixel includes a photosensitive element disposed in a substrate, a filter disposed on the photosensitive element, and a micro-lens disposed on the color filter. A plurality of metal reflectors is disposed on the substrate. The metal reflectors may or may not include metal layer 1 (M1) conductors. In 4-shared pixel architecture, two pixels may share one metal reflector. In the case of a back side illuminated image sensor, when light is incident on the micro-lenses, the micro-lenses focus the light onto their respective photosensitive elements.

Some of the light is coupled to the metal reflectors and may be reflected back to the photosensitive elements. The light may be reflected between the two photosensitive elements that share the same metal reflector. This may be advantageous in the center pixels where light is incident perpendicular to the axis of the micro-lenses. As a result, the center pixels may be more sensitive and have little crosstalk. Light being reflected between the two photosensitive elements that share the same metal reflector maybe disadvantageous for pixels disposed away from the center of the array, however. For the pixels disposed away from the center of the array light is incident at an angle that is tilted from the axis of the micro-lenses. The edge pixels may be less sensitive and have more color crosstalk between the two pixels that share the same metal reflector.

Embodiments of the present invention have the widths of the plurality of metal reflectors scaled from a center of the array of pixels towards at least one edge of the array of pixels such that the metal reflectors at the center pixels are wider than the metal reflectors at the edge pixels. The widths may be gradually reduced rather than reduced in abrupt steps.

One advantage of embodiments of the present invention is that the crosstalk between edge pixels may be reduced. Another advantage is that the image sensor may be more sensitive to incident light at the edge pixels. Other features and advantages of the present invention will be apparent from the accompanying drawings and from the detailed description that follows.

Figure 1:
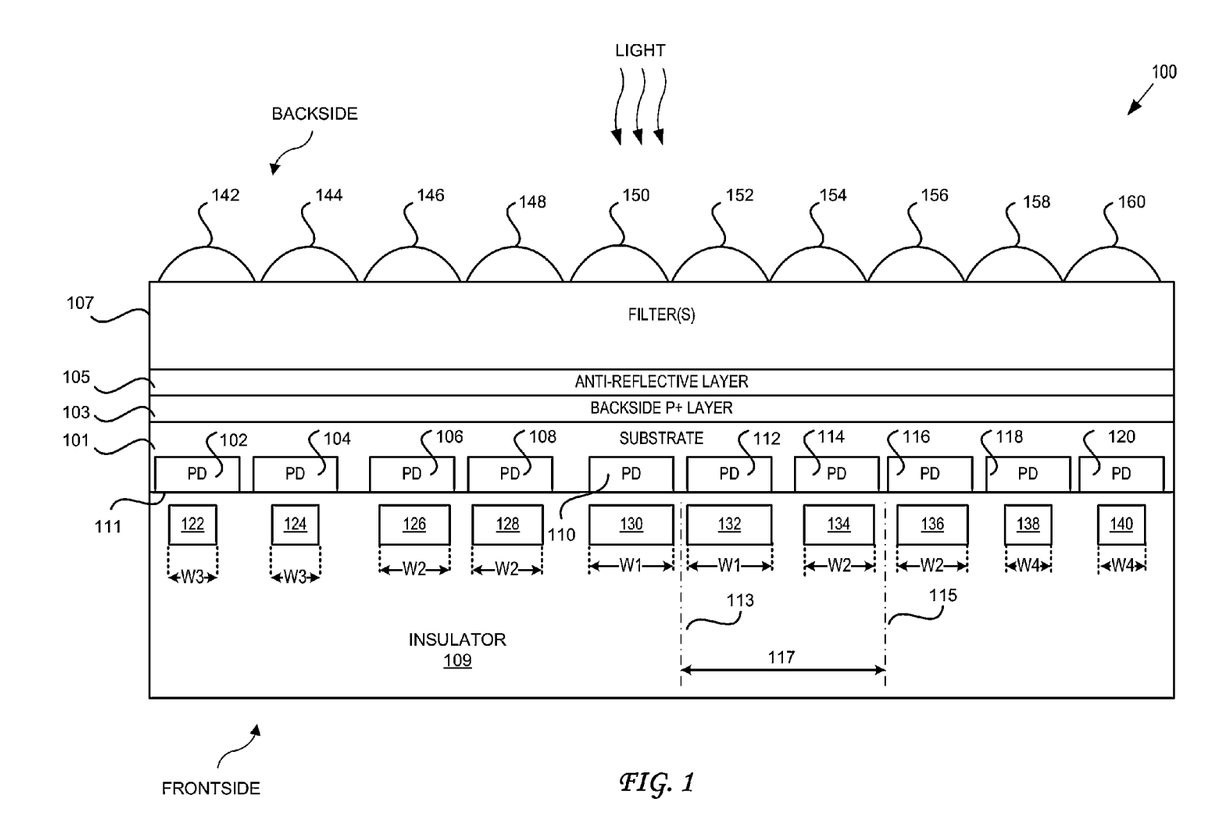
FIG. 1 is a cross-sectional side view of an image sensor according to an embodiment of the present invention.

FIG. 1 is a cross-sectional side view of BSI image sensor 100 according to an embodiment of the present invention. In the illustrated embodiment, image sensor 100 includes substrate 101. Note that in BSI image sensor 100, photodiodes (PDs) are exposed to incident light from a backside of image sensor 100. For some embodiments, the substrate 101 is silicon having a thickness of 1.5 microns. Other thicknesses and/or materials may be suitable as well.

Figure 2:
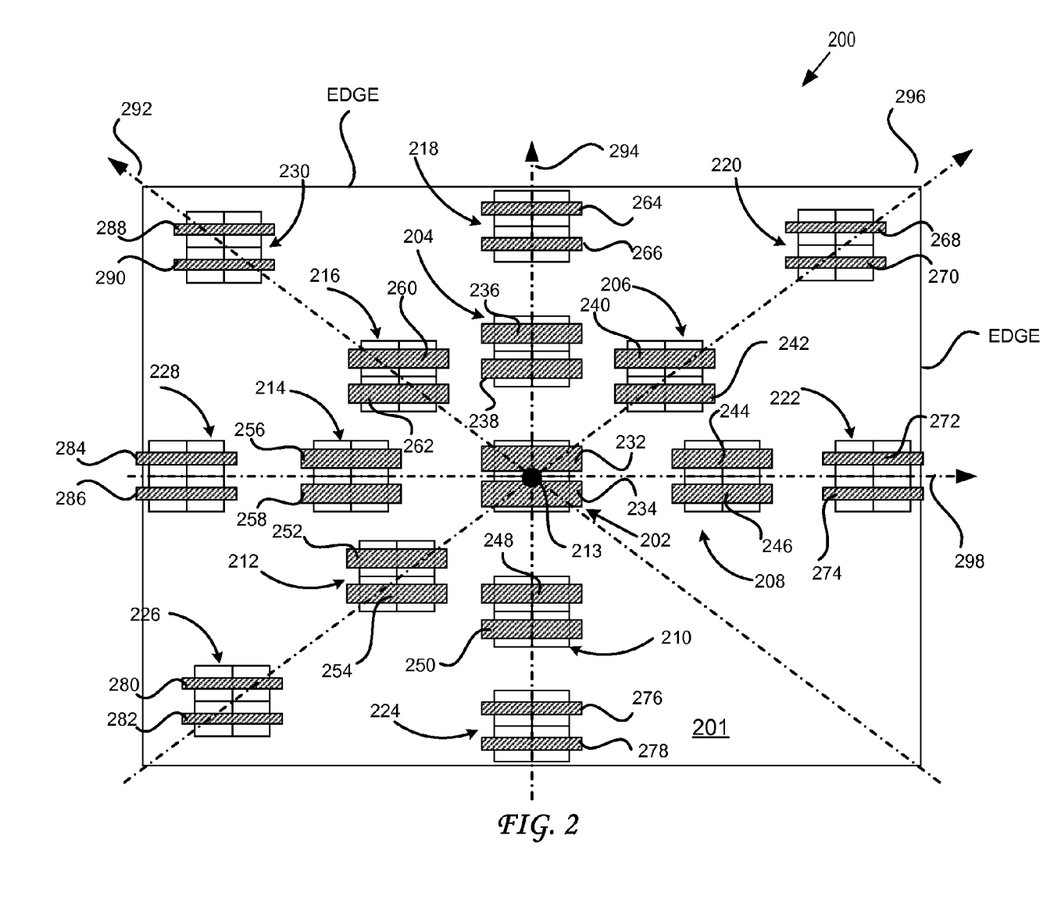
FIG. 2 is a top view of an image sensor according to an embodiment of the present invention.

Generally, image sensor 100 includes several photosensitive elements arranged in an array of two dimensional rows and columns in substrate 101. For purposes of clarity, in the illustrated embodiment, substrate 101 includes ten photosensitive elements, which are shown as photodiodes 102, 104, 106, 108, 110, 112, 114, 116, 118, and 120 disposed in substrate 101. Not shown here, but shown in more detail below in FIG. 2, are the remaining three corresponding pixels for the 4-shared pixel structure, for example structures 202, 204, etc. However, the array can include upwards of thousands of rows and/or columns, or more. Similarly, the array may have an arrangement other than columns and rows.

In the illustrated embodiment, image sensor 100 includes a stack of multiple metal layers, a p+ type doped silicon passivation layer 103 disposed on substrate 101, an anti-reflective layer 105 disposed on passivation layer 103, filters 107, e.g., red, green, blue, cyan, magenta, yellow, or other suitable color filters, disposed on the anti-reflective layer 105, and the like. In the illustrated embodiment, image sensor 100 includes ten metal reflectors 122, 124, 126, 128, 130, 132, 134, 136, 138, and 140 disposed in insulator 109. Not shown here, but shown in more detail below in FIG. 2, are the remaining two corresponding metal conductors for the 4-shared pixel architecture, for example metal conductors 232 and 234 of structure 202.

In the illustrated BSI embodiment, the frontside surface 111 of substrate 101 and photodiodes 102, 104, 106, 108, 110, 112, 114, 116, 118, and 120 are disposed on insulator 109. Metal reflectors 122, 124, 126, 128, 130, 132, 134, 136, 138, and 140 may reflect light to photodiodes 102, 104, 106, 108, 110, 112, 114, 116, 118, and 120, respectively.

For some embodiments, the widths of metal reflectors 122, 124, 126, 128, 130, 132, 134, 136, 138, and 140 are gradually scaled from center metal reflectors 130 and 132 to intermediate metal reflectors 126, 128, 134, and 136, out to edge metal reflectors 122, 124, 138, and 140. For example, center metal reflectors 130 and 132 each has a width of w1, intermediate metal reflectors 126, 128, 134, and 136 each has a width of w2, edge metal reflectors 122 and 124 each has a width of w3, and edge metal reflectors 138 and 140 each has a width of w4.

In one embodiment, the scaling factor used takes into consideration the CRA of the micro-lens, the coordinates of the particular pixel in the array, etc. Various scaling models are described with reference to FIG. 3 below. For example, image sensor 100 is illustrated in FIG. 1 as including a center 113 (i.e., center of array). In one embodiment, the scaling factor may be determined by the distance of the metal reflector from center 113. By way of example, the scaling factor used to determine width w2 may be based on the distance 117 between center 113 and a midpoint 115. As will be discussed further, individual pixels may be grouped together into shared-pixel architectures. Thus, in this example, pixels associated with photodiodes 114 and 116 are grouped together into the same shared pixel architecture where midpoint 115 is a center of the shared-pixel architecture.

In one embodiment, the widths of metal reflectors 122, 124, 126, 128, 130, 132, 134, 136, 138, and 140 do not scale symmetrically. For example, in the illustrated embodiment, edge metal reflectors 122 and 124 have a width of w3 and edge metal reflectors 138 and 140 have a different width of w4. That is, in this embodiment, width w3 is a different width than width w4 even though edge metal reflectors 122 and 124 may be the same distance from center 113 as edge metal reflectors 138 and 140. This asymmetrical scaling of the metal reflectors may occur in an embodiment where the micro-lens height is asymmetric in the pixel array. In some embodiments where the pixel is relatively small, the effective micro-lens height is higher in the diagonal directions (e.g. see axis 292 and 296 in FIG. 2) than in vertical and horizontal directions (e.g., see axis 294 and 298 in FIG. 2). This difference in micro-lens heights may cause a difference in focal point depths, resulting in differences in light reflections at the metal reflectors. Thus, in the asymmetrical embodiment, the widths of the metal reflectors may differ even though their distances from the center of the array are the same.

Alternatively, edge metal reflectors 122, 124, 138, and 140 may have the same or similar widths. This also applies to intermediate metal reflectors 126, 128, 134, and 136. For some embodiments, the scaled widths of metal reflectors 122, 124, 126, 128, 130, 132, 134, 136, 138, and 140 result in reduced color crosstalk at the edge and/or intermediate pixels.

Insulator 109 may insulate the metal reflectors from substrate 101. Insulator 109 may be any dielectric material such as an oxide. For some embodiments, the dielectric material may be a silicon oxide such as silicon dioxide ($SiO_2$). Metal reflectors 122, 124, 126, 128, 130, 132, 134, 136, 138, and 140 may be copper, aluminum, an aluminum-copper mixture, tungsten, TiN, or other metal suitable for carrying a signal or reflecting light.

For some embodiments, image sensor 100 includes a micro-lens for each photosensitive element. In the illustrated embodiment, image sensor 100 includes micro-lenses 142, 144, 146, 148, 150, 152, 154, 156, 158, and 160, for photodiodes 102, 104, 106, 108, 110, 112, 114, 116, 118, and 120, respectively. Micro-lenses 142, 144, 146, 148, 150, 152, 154, 156, 158, and 160 as well as the filters 107 may be disposed on the backside of image sensor 100 using any suitable deposition, etching, or masking technique, as well as planarization, heating, reflow, chemical vapor deposition (CVD), plasma enhanced chemical vapor deposition (PECVD), or other suitable technique, etc.

Image sensor 100 may operate as follows. Light is incident on micro-lenses 142, 144, 146, 148, 150, 152, 154, 156, 158, and 160, which focus the light onto filters 107. Filters 107 passes light to the photodiodes 102, 104, 106, 108, 110, 112, 114, 116, 118, and 120, optionally through anti-reflective material 105 and p+ layer of silicon 103. Some of the light passes to metal reflectors 122, 124, 126, 128, 130, 132, 134, 136, 138, and 140 from photodiodes 102, 104, 106, 108, 110, 112, 114, 116, 118, and 120, respectively, which may reflect light back to photodiodes 102, 104, 106, 108, 110, 112, 114, 116, 118, and 120, respectively.

Photodiodes 102, 104, 106, 108, 110, 112, 114, 116, 118, and 120, convert the light to electrical signals. The electrical signal may have intensity that is proportional to the intensity of the received light. The electrical signals may be coupled to amplification and readout circuitry such as a CMOS transistor (not shown), for example, to generate an image based on the captured light. The gradual scaling of the widths metal reflectors 122, 124, 126, 128, 130, 132, 134, 136, 138, and 140 from the center of the array to the edges of the array allows the center pixels to maintain sensitivity and reduced crosstalk and the pixels away from the center of the array to have better sensitivity and reduced crosstalk.

FIG. 2 is a top view of an image sensor 200 showing scaled metal reflectors according to an embodiment of the present invention. The example image sensor 200 includes an array having a center 213 and fifteen 4-shared pixel architectures, in which two pixels may share one metal reflector. For instance, a substrate 201 has disposed therein one center 4-shared pixel architecture 202, ten intermediate 4-shared pixel architectures 204, 206, 208, 210, 212, 214, 216, 220, 226, and 230. Substrate 201 also has disposed therein four edge 4-shared pixel architectures 218, 222, 224, and 228. As shown in FIG. 2, image sensor 200 includes edges of the pixel array. In one embodiment, the edges represent the furthermost distance that an 4-shared pixel architecture is located from the center and may or may not represent the physical edge of the integrated circuit. For example, located beyond the edges, as shown in FIG. 2 and located on the same piece of silicon may be readout circuitry, control circuitry, and function logic, the operations of which, will be described in more below.

Each example 4-shared pixel architecture includes two metal reflectors. In the illustrated embodiment, pixel architecture 202 includes metal reflectors 232 and 234. Pixel architecture 204 includes two metal reflectors 236 and 238, pixel architecture 206 includes two metal reflectors 240 and 242, pixel architecture 208 includes metal reflectors 244 and 246, pixel architecture 210 includes metal reflectors 248 and 250, and pixel architecture 212 includes metal reflectors 252 and 254. Pixel architecture 214 includes metal reflectors 256 and 258, and pixel architecture 216 includes metal reflectors 260 and 262.

Pixel architecture 218 includes metal reflectors 264 and 266, pixel architecture 220 includes metal reflectors 268 and 270, and pixel architecture 222 includes metal reflectors 272 and 274. Pixel architecture 224 includes metal reflectors 276 and 278, pixel architecture 226 includes metal reflectors 280 and 282, pixel architecture 228 includes metal reflectors 284 and 286, and pixel architecture 230 includes metal reflectors 288 and 290.

Note that metal reflectors 232 and 234 on the center 4-pixel architecture 202 have one width. The widths of the metal reflectors on remaining pixel architectures 204, 206, 208, 210, 212, 214, 216, 218, 220, 222, 224, 226, 228, and 230 are gradually scaled to smaller widths as the pixel architectures move towards the edge of the array. Metal reflectors 232 and 234 are one possible implementation of metal reflectors 130 and 132, respectively, of FIG. 1. Similarly, metal reflectors 256 and 258 are one possible implementation of metal reflectors 126 and 128, respectively, of FIG. 1. The scaling factor function may vary depending on image sensor conditions, such as the relationship between chief ray angles (CRA) and the distance of a pixel architecture from the centre of the array of image sensor 200. In one embodiment, the CRA is a function of the distance from the center 213 of the array and dependent on a module lens specification of the micro-lens. For example, the CRA may be non-linearly dependent on the distance from center 213 where a larger CRA is given at a larger distance. In some embodiments, a larger CRA requires a smaller width of the metal reflectors to reduce cross-talk.

The illustrated embodiment of image sensor 200 includes vertical axis 294, horizontal axis 298, and diagonal axes 292 and 296. In one embodiment, the metal reflectors along the vertical axis 294 and the horizontal axis 298 have a width determined by a first scaling factor function, while metal reflectors along the diagonal axes 292 and 296 have a width determined by a second scaling factor function, where the first and second scaling factor functions are different. As discussed above, this may result in a metal reflector lying on the horizontal axis 298 having a width that is different than a width of a metal reflector lying on the diagonal axis 296 even though their distances from the center of the array are the same. In another embodiment, a single scaling factor function may be used for determining the width of all metal reflectors in the array.

The scaling factor is described with reference to FIG. 3, which shows mathematical models 300 of how to scale the widths of the metal reflectors from the center of an array to the edges according to embodiments of the present invention. Mathematical models 300 are presented with reference to an "x" axis, which represents the distance of the pixel from the center to the edge of the array. The mathematical models 300 also are presented with reference to a "y" axis, which represents the scaling factor.

For some embodiments, the scaling factor may be defined as follows:

$$\text{Scaling factor} = W(r)/W(0)$$

where $W(r)$ represents the width of the metal reflector located at a distance 'r' from the centre of the array and $W(0)$ represents the width of the metal reflector at the centre of the array. Stated another way, $$W(r) = \text{scaling factor} * W(0)$$

Note that scaling may be linear or piece-wise linear. For example, curves 302 and 304 show that the widths of the metal reflectors can be scaled linearly from the pixels in the center of the array out towards the edge of the array. The curves 306, 308, 312, and 314 show piece-wise linear scaling.

Curve 302 illustrates one possible example function for linear scaling the widths of metal reflectors, in accordance with the teachings of the present disclosure. As shown in FIG. 3, curve 302 has a constant slope (e.g., −m) from the center of the array until a distance D4 from the center of the array. In this embodiment, pixels at a distance greater than D4 from the center array do not have an associated metal reflector (i.e., only pixels a distance of D4 or less from the center include a metal reflector, where distance D4 is less than the distance to an edge of the pixel array). Also, pixels at a distant D4 include a metal reflector having a width that is less than the width of a metal reflector at or nearer to the center of the array.

Curve 304 illustrates another example function for linear scaling of the widths of metal reflectors. As shown in FIG. 3, curve 304 has a constant non-zero slope from the center of the array to its edge. Thus, pixels at the edge of the array include a metal reflector having a width that is less than the width of a metal reflector at or nearer to the center of the array.

Figure 3:
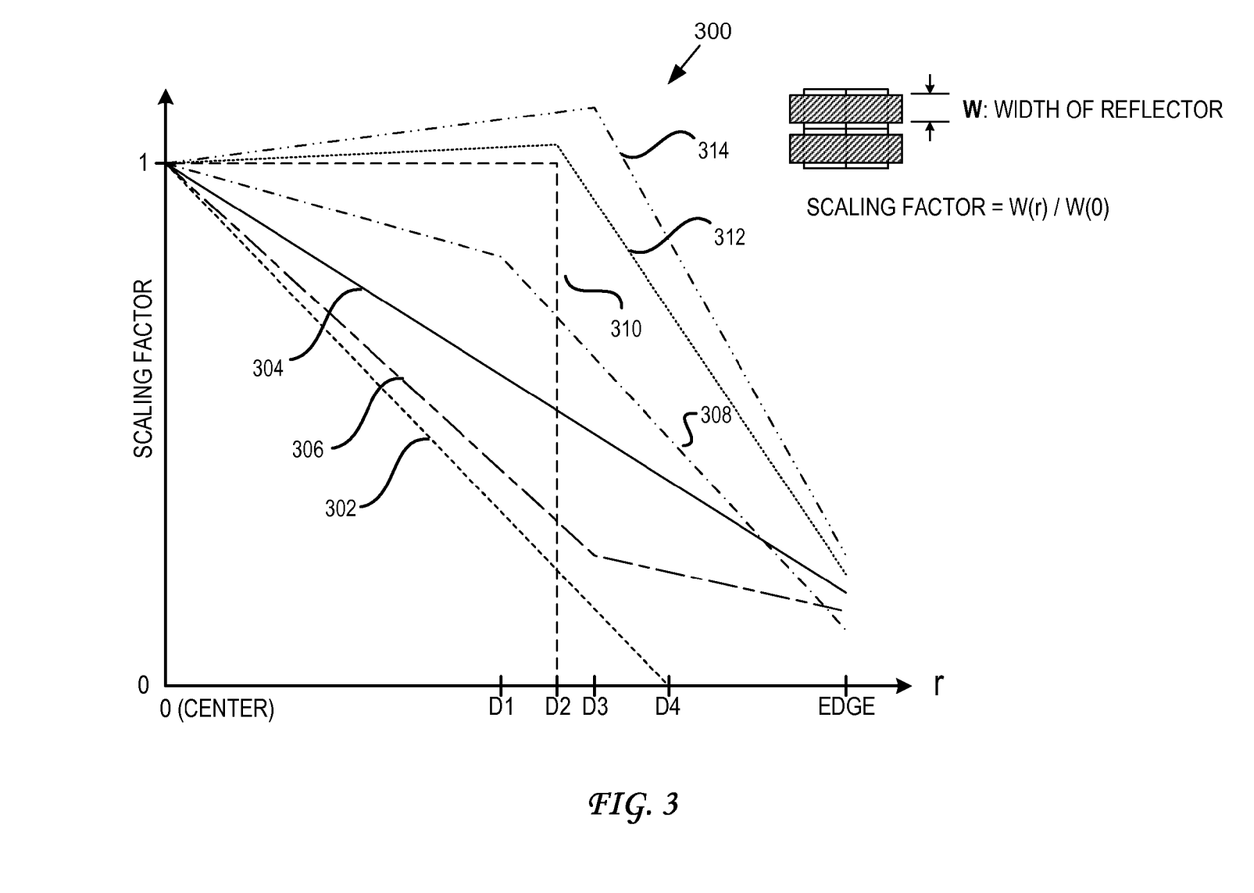
FIG. 3 is a graphical representation illustrating how to determine a scaling factor for metal layers of an image sensor according to an embodiment of the present invention.

As illustrated in FIG. 3, curves 306, 308, 312 and 314 illustrate piece-wise linear scaling of the widths of the metal reflectors. For example, curve 306 includes a first linear segment having a first slope from the center of the array to a distance D3 from the center. Curve 306 also includes a second linear segment having a second slope from distance D3 to the edge of the array, where a magnitude of the first slope is greater than a magnitude of the second slope. Curve 308 includes a first linear segment having a first slope from the center of the array to a distance D1 and then a second slope for a second linear segment extending from distance D1 to the edge of the array. In the example of curve 308, a magnitude of the first slope is less than a magnitude of the second slope.

The illustrated examples of curves 312 and 314 each include a first linear segment having a positive slope such that metal reflectors further away from the center of the array may increase in width to greater than a width of the metal reflector at the center.

Also shown in FIG. 3, is curve 310, illustrating that in one embodiment the metal reflectors may have a fixed width up until a distance D2 from the center of the array. That is, in the illustrated example, curve 310 has a zero slope from the center of the array to distance D2. For pixels at a distance greater than D2, there is no associated metal reflector (i.e., only pixels a distance of D2 or less from the center include a metal reflector, where distance D2 is less than the distance to an edge of the pixel array).

Figure 4:
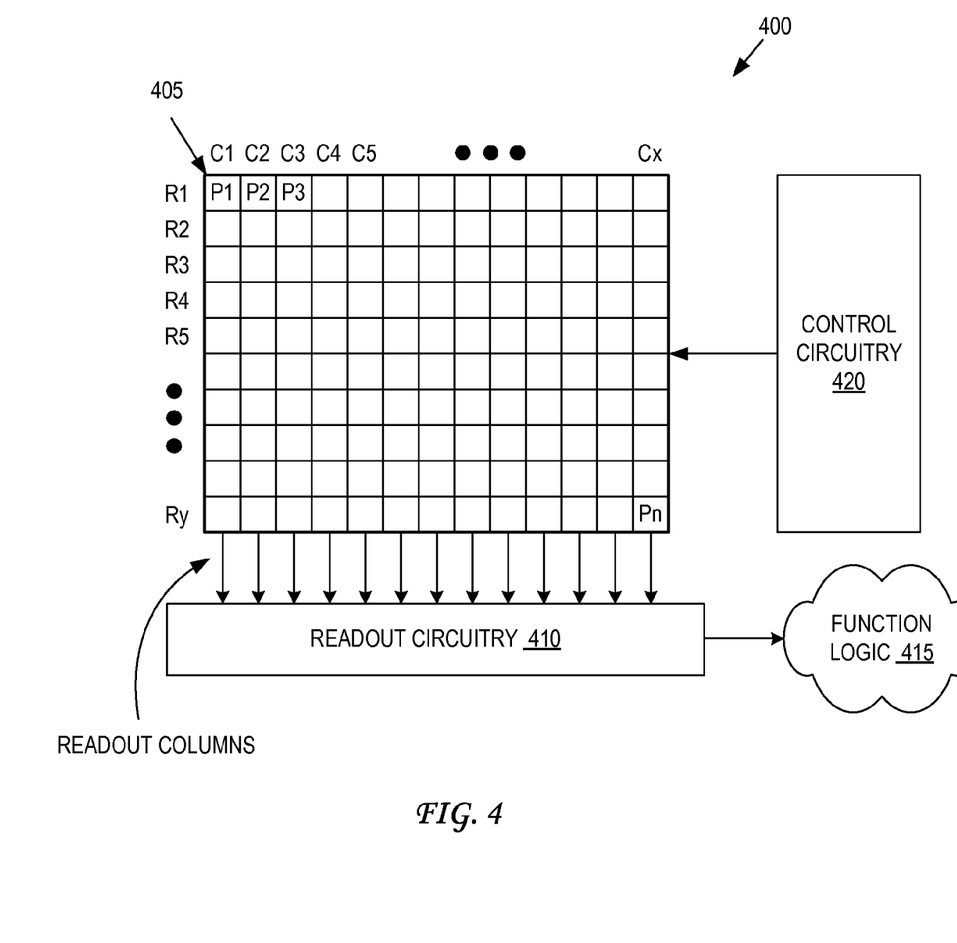
FIG. 4 is a block diagram illustrating an image sensor, in accordance with an embodiment.

FIG. 4 is a block diagram illustrating a CMOS image sensor CIS 400, in accordance with an embodiment. The illustrated embodiment of CIS 400 includes pixel array 405 having some or all of the above described improved characteristics, readout circuitry 410, function logic 415, and control circuitry 420. Pixel array 405 is a two-dimensional ("2D") array of image sensor pixels (e.g., pixels P1, P2 . . . , Pn). In one embodiment, each pixel is implemented using pixel 100, illustrated in FIG. 1. In one embodiment, each pixel is a CIS pixel. In one embodiment, pixel array 405 includes a color filter array including a color pattern (e.g., Bayer pattern or mosaic) of red, green, and blue filters. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 410 and transferred to function logic 415. Readout circuitry 410 may include amplification circuitry, analog-to-digital ("ADC") conversion circuitry, or otherwise. Function logic 415 may simply store the image data or even manipulate the image data by applying post image effects (e.g., crop, rotate, remove red eye, adjust brightness, adjust contrast, or otherwise). In one embodiment, readout circuitry 410 may readout a row of image data at a time along readout column lines (illustrated) or may readout the image data using a variety of other techniques (not illustrated), such as a column/row readout, a serial readout, or a full parallel readout of all pixels simultaneously. Control circuitry 420 is connected with pixel array 405 to control operational characteristic of pixel array 405. For example, control circuitry 420 may generate a shutter signal for controlling image acquisition.

Figure 5:
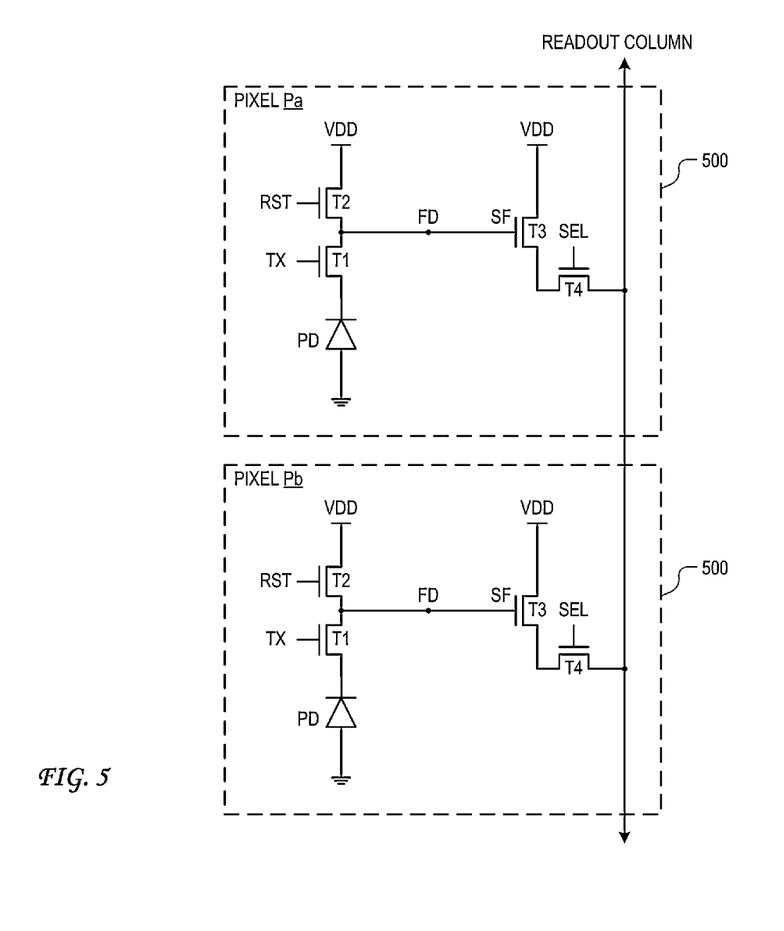
FIG. 5 is a circuit diagram illustrating sample pixel circuitry of two image sensor pixels within an image sensor array, in accordance with an embodiment.

FIG. 5 is a circuit diagram illustrating a pixel circuitry 500 of two four-transistor ("4T") pixels within a pixel array, in accordance with an embodiment of the invention. Pixel circuitry 500 is one possible pixel circuitry architecture for implementing each pixel within 4-shared pixel architecture 202 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 5, pixels Pa and Pb are arranged in two rows and one column. The illustrated embodiment of each pixel circuitry 500 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 500 to the readout column line under control of a select signal SEL.

Figure 6:
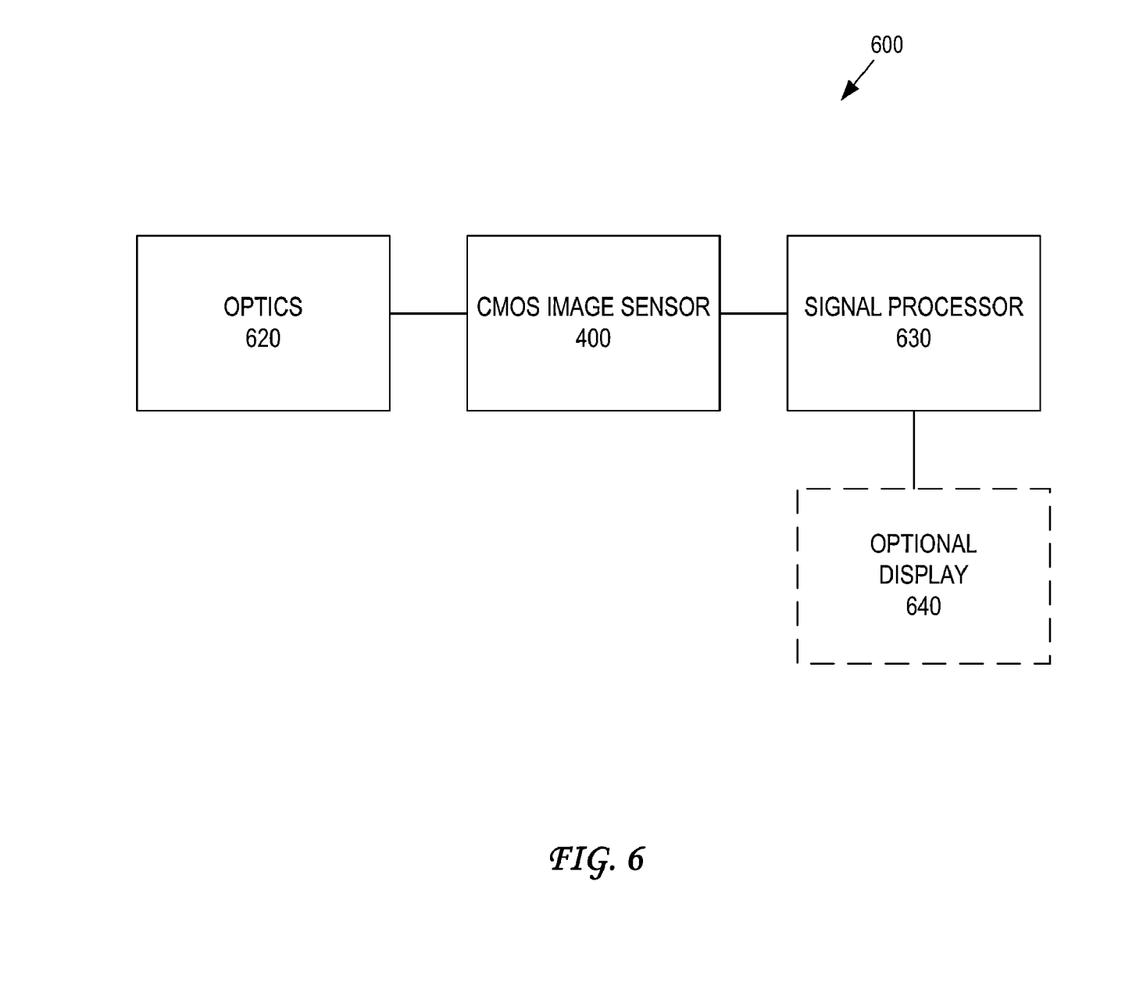
FIG. 6 is a block diagram illustrating an imaging system, in accordance with an embodiment.

FIG. 6 illustrates an imaging system 600 that utilizes CIS 400, according to an embodiment of the disclosure. Image system 600 further includes imaging optics 620 for directing light from an item to be imaged onto CIS 400, and may also include a signal processor 630 for producing processed image data for display on a display 640.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
   an array of imaging pixels disposed within a semiconductor layer, wherein each imaging pixel in the array of imaging pixels includes a photosensitive element configured to receive light from a backside of the image sensor;
   an insulator layer disposed on a frontside of the semiconductor layer; and
   a plurality of metal reflectors disposed within the insulator layer to reflect the light to a respective photosensitive element, wherein a width of each of the plurality of metal reflectors is equal to a width of a metal reflector at the center of the array multiplied by a scaling factor, wherein the scaling factor is dependent on a distance of the metal reflector from the center of the array, and
   wherein the plurality of metal reflectors includes a first metal reflector disposed generally along a first axis of the image sensor and a second metal reflector disposed generally along a second axis of the image sensor, wherein the first metal reflector and the second metal reflector are a same distance from the center of the array and wherein a width of the first metal reflector is different than a width of the second metal reflector.

2. The image sensor of claim 1, further comprising a plurality of microlenses, wherein each of the plurality of microlenses are disposed to focus the light onto a respective photosensitive element, and wherein the scaling factor for each metal reflector is further dependent on a chief ray angle of each respective microlens.

3. The image sensor of claim 1, wherein each of the plurality of metal reflectors are disposed on two imaging pixels in the array of imaging pixels.

4. The image sensor of claim 1, wherein the plurality of metal reflectors gradually decrease in width from the center of the array to an edge of the array.

5. The image sensor of claim 1, wherein the scaling factor is determined in response to a linear function having a non-zero slope for distances at the center of the array to an edge of the array.

6. The image sensor of claim 1, wherein the scaling factor for metal reflectors located at the center of the array to an intermediate distance from the center of the array is determined in response to a linear function having a non-zero slope and wherein pixels between the intermediate distance and an edge of the array do not include an associated metal reflector.

7. The image sensor of claim 1, wherein the scaling factor is determined in response to a piece-wise linear function having a first segment and a second segment, wherein the first segment has a slope that is different than a slope of the second segment.

8. The image sensor of claim 7, wherein a magnitude of the slope of the first segment is greater than a magnitude of the slope of the second segment.

9. The image sensor of claim 7, wherein a magnitude of the slope of the second segment is greater than a magnitude of the slope of the first segment.

10. The image sensor of claim 7, wherein the slope of the first segment is a positive.

11. The image sensor of claim 1, wherein the scaling factor is constant for metal reflectors located at the center of the array to an intermediate distance from the center of the array and wherein pixels between the intermediate distance and an edge of the array do not include an associated metal reflector.

12. A method of operating an image sensor, comprising:
receiving light at an array of pixels disposed in a semiconductor layer;
reflecting light off a plurality of metal reflectors disposed within an insulator layer, wherein the insulator layer is disposed on a frontside of the semiconductor layer and wherein a width of each of the plurality of metal reflectors is equal to a width of a metal reflector at the center of the array multiplied by a scaling factor, wherein the scaling factor is dependent on a distance of the metal reflector from the center of the array, and
wherein the plurality of metal reflectors includes a first metal reflector disposed generally along a first axis of the image sensor and a second metal reflector disposed generally along a second axis of the image sensor, wherein the first metal reflector and the second metal reflector are a same distance from the center of the array and wherein a width of the first metal reflector is different than a width of the second metal reflector.

13. The method of claim 12, further comprising focusing the light onto photosensitive elements included in the array of pixels with a plurality of microlenses, wherein the scaling factor for each metal reflector is further dependent on a chief ray angle of each respective microlens.

14. The method of claim 12, wherein the plurality of metal reflectors gradually decrease in width from the center of the array to an edge of the array.

15. The method of claim 12, wherein the scaling factor is determined in response to a linear function having a non-zero slope for distances from the center of the array to an edge of the array.

16. The method of claim 12, wherein the scaling factor is determined in response to a piece-wise linear function having a first segment and a second segment, wherein the first segment has a slope that is different than a slope of the second segment.

17. The method of claim 16, wherein a magnitude of the slope of the first segment is greater than a magnitude of the slope of the second segment.

18. The method of claim 16, wherein a magnitude of the slope of the second segment is greater than a magnitude of the slope of the first segment.

19. The method of claim 12, wherein the scaling factor is constant for metal reflectors located at the center of the array to an intermediate distance from the center of the array and wherein pixels between the intermediate distance and an edge of the array do not include an associated metal reflector.

* * * * *